United States Patent [19]
Hausdorf et al.

[11] Patent Number: 5,498,471
[45] Date of Patent: Mar. 12, 1996

[54] FLAME-RESISTANT SUBSTRATE FOR FLEXIBLE CIRCUIT BOARDS

[75] Inventors: Jorg Hausdorf, Morlenbach; Thomas Kuhlmann, Heidelberg; Rolf Schneider, Bensheim-Zell; Steffen Kosack, Hassloch; Werner Schafer, Birkenau; Volker Siekermann, Furth, all of Germany

[73] Assignee: Firma Carl Freudenberg, Weinheim, Germany

[21] Appl. No.: 467,325

[22] Filed: Jun. 6, 1995

Related U.S. Application Data

[63] Continuation of Ser. No. 748,623, Aug. 21, 1991, abandoned.

[30] Foreign Application Priority Data

Aug. 21, 1990 [DE] Germany ............ 40 26 354.1

[51] Int. Cl.[6] ...................................... B32B 5/16
[52] U.S. Cl. ................... 428/283; 428/290; 428/901; 523/220; 427/96; 427/121; 427/123; 427/389.9; 427/391
[58] Field of Search ..................... 428/283, 290, 428/901; 523/220; 427/96, 121, 123, 389.9, 391

[56] References Cited

U.S. PATENT DOCUMENTS

| | | | |
|---|---|---|---|
| 4,075,420 | 2/1978 | Walton | 174/117 |
| 4,311,749 | 1/1982 | Hiraiwa et al. | 428/209 |
| 4,314,002 | 2/1982 | Oizumi et al. | 428/414 |
| 4,476,277 | 10/1984 | Koyama et al. | 524/509 |
| 4,866,114 | 9/1989 | Taubitz et al. | 524/100 |

FOREIGN PATENT DOCUMENTS 2211852 12/1989 United Kingdom ............. B32B 27/4

Primary Examiner—Christopher W. Raimund
Attorney, Agent, or Firm—Kenyon & Kenyon

[57] ABSTRACT

A thermostable substrate for flexible circuit boards having excellent flame-resistance, handling, and storage qualities may be produced by treating a substrate of a nonwoven fabric or paper with a flame-resistant, halogen-free polymeric composition. The polymeric composition comprises an aqueous mixture of a copolymerizate of acrylic acid esters and styrene, and an aminoplastic or phenoplastic precondensate to which a mixture of fine-particle red phosphorus and fine-particle ammonium polyphosphate is also added.

14 Claims, No Drawings

FLAME-RESISTANT SUBSTRATE FOR FLEXIBLE CIRCUIT BOARDS

This application is a continuation, of application Ser. No. 07/748,623 filed Aug. 21, 1991, now abandoned.

The present invention relates to a flame-resistant, thermostable substrate for metal foils in flexible circuit boards.

BACKGROUND OF THE INVENTION

Flexible printed circuits have gained widespread use in applications where flexing is a functional requirement, such as where flexing facilitates assembly and disassembly, or other dimensional variations need to be accommodated. In general, flexible circuits are formed by bonding a conductive layer, e.g., a metal foil as copper, onto a flexible insulating film or substrate such as a polyester or polyimide resin film. The substrate is generally temperature-resistant and dimensionally stable. A circuit is formed in the metal foil by conventional etching techniques.

Flexible printed circuits may be covered with an additional layer of a similar insulating film or substrate and bonded with an adhesive to provide additional insulation. The additional layer of the insulating film may also protect the circuit pattern from contamination, corrosion, and mechanical damage. Further, the cover film may also be necessary for the formation of a symmetrical layered structure and/or a solder stop mask.

A problem associated with flexible printed circuit boards is that heat generated by a current flowing through the circuit can cause the substrate, the cover film, or the adhesive to be ignited. Thus, a flexible printed circuit board is a potential cause of fire in instruments and devices utilizing such boards. One approach to this problem is to include flame retardants in an adhesive applied to the board. Generally, the adhesive may be rendered flame-resistant or self-extinguishing by adding halogenated flame inhibitors.

EP-B-14-444 is directed to an insulating laminate which consists of several sheets of reinforcements impregnated with a resin and layers of resin between each reinforcement. According to EP-B-14-444, a curable resin is dissolved in solvent and used to saturate the reinforcement sheets. A copper foil is applied to the saturated reinforcement sheets, and laminated under pressure and heat.

OBJECTS AND SUMMARY OF THE INVENTION

It is an object of the present invention to provide a substrate for flexible circuit boards utilizing a non-flowing coating or impregnating composition which can be laminated without the formation of bubbles.

It is a further object of the present invention to provide a flame-resistant substrate for flexible circuit boards that avoids the use of adhesives containing solvents.

Another object of the present invention is to provide a substrate for flexible circuit boards that is flame resistant without the use of halogenated flame inhibitors.

It is another object of the present invention to securely adhere finished circuit patterns on a nonwoven fabric substrate without intermediate layers.

It is a further object of the present invention to provide a bond between a substrate and a conductive layer, e.g., a metal foil, that possesses a peel resistance equal or greater than 0.7 N/mm according to the IPC standard, that is resistant to solder baths (about 290° C., 20 s), and that is capable of meeting the standards of UL 94, Class V0.

The invention provides a flame-resistant substrate for flexible circuit boards comprising a nonwoven fabric or paper combined with an aqueous, flame-resistant, halogen-free polymeric composition or adhesive including (a) a cross-linked product of an aqueous dispersion of a thermally cross-linkable copolymerizate of acrylic acid esters and styrene, and (b) an aqueous solution of precondensate containing hydroxymethyl groups selected from the group consisting of aminoplastics and phenoplastics. The polymeric composition or adhesive further includes a flame retardant such as a mixture of red phosphorus and ammonium polyphosphate. The invention also provides a method for adhering a conductive layer to a substrate for flexible printed circuit boards under heat and pressure.

It is known that the aforementioned copolymerizate and precondensate are individually suited for coating, laminating, and adhesive purposes. It was unexpected, however, that a mixture of these ingredients, in combination with the halogen-free, flame-resistant mixture, would result in a composition that meets the aforementioned requirements of flexible circuit boards when coated or impregnated on a nonwoven fabric or paper.

DETAILED DESCRIPTION OF THE INVENTION

The flame-resistant substrate according to the invention includes a substrate of nonwoven fabric or paper coated or impregnated with a polymeric composition in an amount in the range of about 30 to 60 g/m$^2$ (dry). The polymeric composition is comprised of a cross-linked product of:

(a) about a 50% aqueous dispersion of a thermally cross-linkable copolymerizate of acrylic acid esters and styrene, where the copolymerizate has a glass transition temperature of about +31° C., and (b) about a 60% aqueous solution of a precondensate including hydroxymethyl groups, selected from the group consisting of aminoplastics and phenoplastics (c) having a ratio of (a) to (b) (dry) of about 10.0:0.8 to about 10.0:2.0.

The ratio of the 50% aqueous dispersion of the copolymerizate to the 60% aqueous solution of an aminoplastic or phenoplastic precondensate containing hydroxymethyl groups is preferably in the range of 10.0:0.8 to 10.0:2.0 (dry) in order to obtain a chemical cross-linked product. If the proportion of precondensate is greater, the resulting composition may be brittle and tend to form bubbles. Conversely, if the proportion of precondensate is smaller, the resulting composition may be too low in cross-linking density.

To satisfy UL 94 (Class V0) flame-inhibiting standards, a finely dispersed flame-retardant mixture of red phosphorus and ammonium polyphosphate (in a ratio of approximately 1.0:10.0) is added to the polymeric composition in an approximate ratio of 1.0:0.9. The grain size of the red phosphorus ranges from about 0.045 to 0.10 mm, and the grain size of the ammonium polyphosphate ranges from about 0.025 to 0.075 mm. A phosphorus concentration outside the suggested concentration may result in a polymeric composition that does not meet UL 94 (Class V0) standards. Furthermore, in one embodiment of the invention, a finely dispersed distribution of the flame-retardant mixture in the cross-linking system is necessary.

The components described above may be mixed in a high-speed stirrer to form a flame-resistant composition. The flame-resistant composition may be brushed, spread with a doctor blade or spreader, or printed on the substrate. Cutouts or bolts of the substrate may be coated or impregnated, and dried at about 100° to 120° C. for about 10 minutes. The coated or impregnated substrate (to which a conductive layer, e.g., a metal foil, may or may not be adhered), can be stored for extended periods without significant loss of advantageous qualities before use in the manufacture of flexible printed circuit boards.

The components for the polymeric composition and flame-retardant mixture are commercially available: the copolymerizate of acrylic acid esters and styrene is available under the tradename Acronal S 886 S or Acronal 12 DE (BASF); a melamine resin formaldehyde precondensate is available under the tradename Cassurit F (Hoechst); the red phosphorus powder in a grain size between 0.045 to 0.10 mm is available under the tradename Exolit 405 (Hoechst); and the ammonium polyphosphate with an average grain size of 0.025 to 0.075 mm is available under the tradename Exolit 422 (Hoechst).

Under the present invention, it is possible to mix two different types of commercially available aqueous dispersions of the copolymerizate of acrylic acid esters and styrene with each other. Mixing enables one to achieve a desired flexibility of the coated or impregnated nonwoven fabric, as well as, desired wet adhesion to the metal foil. A suitable mixture ratio of the copolymerizate dispersions can be determined empirically.

The flame-resistant composition of the present invention is aqueous and does not contain halogen associated flame inhibitors. Thus, the flame-resistant composition of the present invention eliminates the usual protective and disposal procedures necessary with the use of non-aqueous, solvent-based adhesives and halogen containing flame inhibitors.

The following is an example of lamination of a metal foil to a coated or impregnated substrate of nonwoven fabric for use in flexible printed circuit boards. The copolymerizate of acrylic acid esters and styrene in 50% aqueous dispersion, the melamine resin formaldehyde precondensate, the phosphorus powder and the ammonium polyphosphate are mixed with water and a pigment, in a high-speed stirrer, in various proportions in accordance with the examples of Table 1. The mixture is then coated or impregnated on a substrate of a nonwoven, polyamide-polyester fabric having the following specifications:

| | |
|---|---|
| Area weight: | 49 g/m² |
| Thickness: | 0.071 mm |
| Maximum tensile strength: | 134 N |
| extensibility: | 24% |
| Air permeability: | 207 dm³/s/m² | with a spreader, in an amount of 40 g/m² (dry). Drying takes place at 110° C. for 10 minutes. After drying, coated substrate and copper foil cutouts are produced and the copper foil is laminated to the coated substrate under pressure and heat, e.g., in a press at 200° C. The peel resistance between the nonwoven fabric and the copper foil, the solder bath resistance of the laminate, burning behavior, and bubble formation in the laminate is then checked.

An alternative method according to the present invention provides for the manufacture of printed-circuit stock material for flexible circuit boards. A metal foil is laminated to the coated or impregnated substrate of the present invention. An electrical circuit is then formed in the metal foil by conventional etching techniques. This procedure is advantageous in the manufacture of flexible printed circuits as the stock material demonstrates good handling and storage qualities.

Another alternative method according to the present invention comprises introducing a circuit pattern in a metal foil and subsequently laminating the circuit pattern to the coated or impregnated substrate. Expensive and complicated etching processes are eliminated under this method, and ecological benefits are achieved by avoiding the usual waste disposal procedures associated with printed circuit etching. Circuit patterns with widths of individual tracks down to 0.2 mm may be laminated without difficulty.

Table 1 shows the results of tests performed on five examples prepared according to the present invention.

TABLE 1

| Examples | 1 | 2 | 3 | 4 | 5 |
|---|---|---|---|---|---|
| Copolymerizate of acrylic acid esters and styrene, 50% dispersion, Acronal 12 DE (BASF) (component (a)) | 200 | 200 | 200 | 200 | 200 |
| Melamine resin formaldehyde precondensate, (component (b)) | 20 | 20 | 20 | — | 40 |
| Exolit 405, (component (c)) | 8 | 12 | 5 | 8 | 8 |
| Exolit 422, (component (d)) | 10 | 10 | 10 | 10 | 10 |
| Water | 90 | 90 | 90 | 90 | 90 |
| Pigment Luconyl blue (BASF) | 10 | 10 | 10 | 10 | 10 |
| Peel resistance nonwoven/copper (N/mm) | >0.7 | >0.7 | >0.7 | <0.7 | >0.7 |
| Solder bath resistance at 290° C./20 s | met | met | met | not met | met |
| Burning behavior according to UL 94 | V0 | * | * | V0 | V0 |
| Surface after pressing (bubbles) | sm. | sm. | sm. [sm. = smooth] | sm. | |

* = UL 94 V0 not met
The numerical information relates to parts by weight, unless otherwise indicated.

What is claimed is:

1. A polymeric composition comprising a cross-linked product of:
   (a) about a 50% aqueous dispersion of a thermally cross-linkable copolymerizate of acrylic acid esters and styrene having a glass transition temperature of about +31° C., and
   (b) about a 60% aqueous solution including hydroxymethyl groups, selected from the group consisting of aminoplastics and phenoplastics,
   where the ratio of (a) to (b) (dry) is about 10.0: 0.8 to 10.0:2.0; and
   (c) a flame retardant comprising:
      (i) red phosphorus with a grain size of 0.045 to 0.10 mm, and
      (ii) ammonium polyphosphate with a grain size of 0.025 to 0.075 mm.

2. A flame-resistant substrate for flexible circuit boards comprising the polymeric composition of claim 1 coated on nonwoven fabric.

3. A flame-resistant substrate for flexible circuit boards comprising the polymeric composition of claim 1 coated on paper.

4. A flame-resistant substrate for flexible circuit boards comprising the polymeric composition of claim 1 impregnated in nonwoven fabric.

5. A flame-resistant substrate for flexible circuit boards comprising the polymeric composition of claim 1 impregnated in paper.

6. The substrate for flexible circuit boards of claim 4 wherein said polymeric composition is impregnated in said nonwoven fabric in an amount of about 30 to 60 g/m² (dry).

7. The substrate for flexible circuit boards of claim 5 wherein said polymer composition is impregnated in said paper in an amount of about 30 to 60 g/m² (dry).

8. The flame-resistant substrate for flexible circuit boards of claim 2 wherein said polymeric composition is coated on said nonwoven fabric in an amount of about 30 to 60 g/m² (dry).

9. The flame-resistant substrate for flexible circuit boards of claim 4 wherein said polymeric composition is impregnated in said nonwoven fabric in an amount of about 30 to 60 g/m² (dry).

10. The substrate of claim 6 wherein said nonwoven fabric has the following specifications: area weight: 49 g/m², thickness: 0.071 mm, maximum tensile strength: 134 N, extensibility 24%, and air permeability: 207 dm³/s/m².

11. The flame-resistant substrate of claim 2 wherein said nonwoven fabric has the following specifications: area weight: 49 g/m², thickness: 0.071 mm, maximum tensile strength: 134 N, extensibility 24%, and air permeability: 207 dm³/s/m².

12. A method for making flexible printed circuit boards, comprising the steps of:
   (a) applying the polymeric composition of claim 1 in an amount of about 30 to 60 g/m² to a nonwoven fabric to form a substrate;
   (b) drying said polymeric composition on said substrate; and
   (c) applying a conductive layer to a surface of said substrate of step (b).

13. A method for making flame-resistant flexible printed circuit boards, comprising the steps of:
   (a) introducing a circuit pattern in a conductive layer;
   (b) applying the polymeric composition of claim 1 in an amount of about 30 to 60 g/m² to a nonwoven fabric to form a substrate;
   (c) drying said polymeric composition on said substrate; and
   (d) applying said conductive layer to a surface of said substrate of step (c).

14. A flame-resistant flexible printed circuit board comprising:
   a conductive layer,
   an aqueous, halogen-free polymeric composition applied in an amount of about 30 to 60 g/m² (dry) to a substrate, wherein said substrate comprises a nonwoven fabric having the following specifications: area weight: 49 g/m², thickness: 0.071 mm, maximum tensile strength: 134 N, extensibility: 24%, and air permeability: 207 dm³/s/m², and said polymeric adhesive comprises a cross-linked product of:
   (a) about a 50% aqueous dispersion of a thermally cross-linkable of acrylic acid esters and styrene copolymerizate having a glass transition temperature of about +31° C.
   (b) about a 60% aqueous solution including hydroxymethyl groups, selected from the group consisting of aminoplastics and phenoplastics,
   where the ratio of (a) to (b) (dry) is about 10.0: 0.8 to 10.0:2.0,
   (c) red phosphorus with a grain size of 0.045 to 0.10 mm, and
   (d) ammonium polyphosphate with a grain size of 0.025 to 0.075 mm are added, where the ratio of (c): (d) is about 1.0:10.0, and the ratio of ((a)+ (b)) to ((c)+ (d)) is about 1.0:0.9, and
   said conductive layer is adhered to said substrate under heat and pressure.

* * * * *